(12) United States Patent
Ueda et al.

(10) Patent No.: US 6,238,966 B1
(45) Date of Patent: *May 29, 2001

(54) SEMICONDUCTOR MEMORY DEVICE AND METHOD FOR FABRICATING THE SAME

(75) Inventors: Michihito Ueda; Takashi Ohtsuka, both of Osaka (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/379,857

(22) Filed: Aug. 24, 1999

Related U.S. Application Data (62) Division of application No. 09/310,313, filed on May 12, 1999.

(30) Foreign Application Priority Data

May 13, 1998 (JP) .................................. 10-130172

(51) Int. Cl.$^7$ ..................................... H01L 29/72
(52) U.S. Cl. .......................... 438/240; 438/250; 438/253
(58) Field of Search ..................... 438/240, 250, 438/253; 361/313, 321.5

(56) References Cited

U.S. PATENT DOCUMENTS 5,572,052  11/1996  Kashihara et al. .
5,690,727  11/1997  Azuma et al. .
5,854,734  * 12/1998  Sandhu et al. .......................... 437/52

OTHER PUBLICATIONS

Jpn. J. Appl. Phys.vol. 33 (1994) pp. 5129–5134 Part 1, No. 9B, Sep. 1994.

* cited by examiner

*Primary Examiner*—Edward Wojciechowicz
(74) *Attorney, Agent, or Firm*—Harness, Dickey & Pierce, P.L.C.

(57) ABSTRACT

A low-leakage-current layer, made of BST in which the content of Ti deviates from its stoichiometric composition, is interposed between a high-dielectric-constant layer, made of BST with the stoichiometric composition, and an upper electrode. And a charge-storable dielectric film is made up of the high-dielectric-constant layer and the low-leakage-current layer. Such a BST film containing a larger number of Ti atoms than that defined by stoichiometry can suppress the leakage current to a larger degree. Also, if such a film is used, then the relative dielectric constant does not decrease so much as a BST film with the stoichiometric composition. Accordingly, the leakage current can be suppressed while minimizing the decrease in relative dielectric constant of the entire charge-storable dielectric film, which is a serial connection of capacitors, thus contributing to the downsizing of a semiconductor memory device. As a result, a semiconductor memory device, including a charge-storable dielectric film with decreased leakage current and enhanced charge storability, can be obtained.

5 Claims, 7 Drawing Sheets

Content of Ti [%]

SEMICONDUCTOR MEMORY DEVICE AND METHOD FOR FABRICATING THE SAME

This is a division of U.S. patent application Ser. No. 09/310,313, filed May 12, 1999.

BACKGROUND OF THE INVENTION

The present invention relates to a semiconductor memory device for storing electrical charges as information in a capacitive insulating film made of a material with a high relative dielectric constant, and also relates to a method for fabricating the same.

As the multimedia applications have been broadening in recent years, it has become more and more necessary to store and process an increasing quantity of digital information using various types of information processors. Under the circumstances such as these, the quantity of information to be processed per unit time, i.e., the capacity of each single semiconductor memory device used for storing that information thereon, would continue to rise by leaps and bounds. However, in a dynamic random access memory (DRAM), for example, as the required capacity increases, the charge storage capacity of each cell should be maintained at an approximately conventional level (i.e., about 30 fF), even though the size of each cell should be reduced to satisfy a downsizing requirement. Accordingly, to ensure a sufficient capacity and reduce the size of a cell at the same time, various materials with a high relative dielectric constant, such as barium strontium titanate (BST), have lately been applied to the capacitive insulating film of a memory cell more and more often. In this specification, a capacitive insulating film of this type, which is made of a material with a high dielectric constant and in which electrical charges can be stored as information, will be called a "charge-storable dielectric film".

Nevertheless, since a BST film is usually in the form of a polycrystalline thin film, it is important to suppress the leakage current flowing therethrough.

To solve such a problem, a "multi-layered dielectric film" is used as disclosed in Japanese Laid-Open Publication No. 7-161833, for example.

Figure 8:
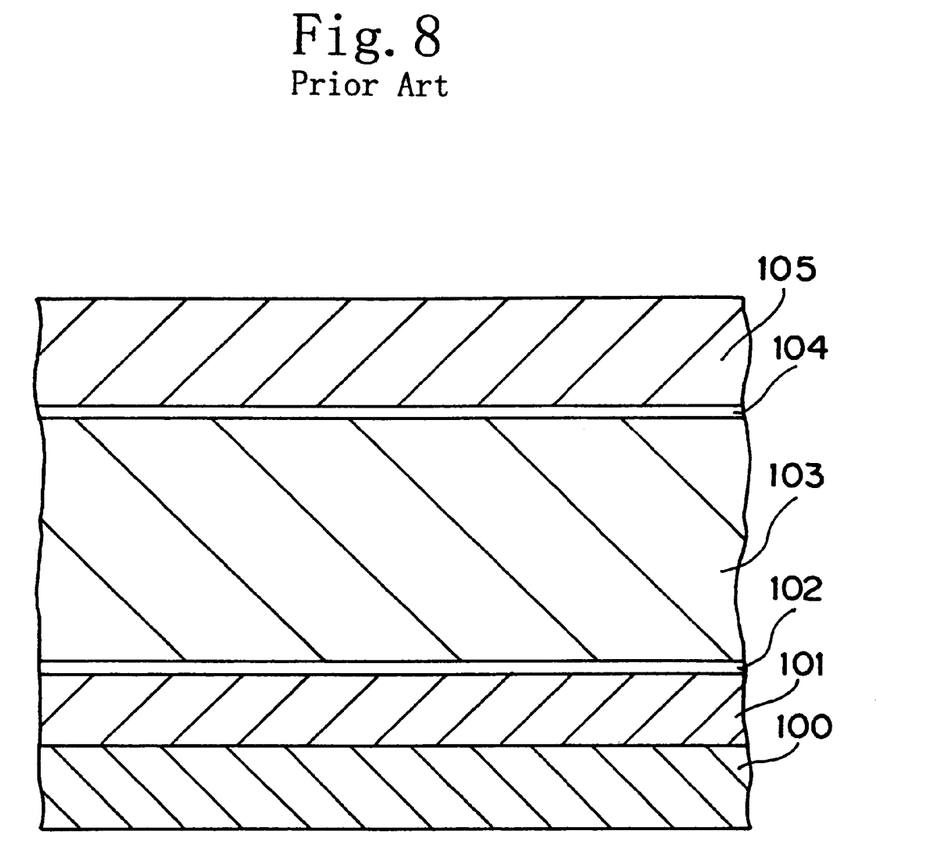
FIG. 8 is a partial cross-sectional view illustrating a structure of a cell and its neighboring portions of a conventional semiconductor memory device.

FIG. 8 illustrates a cross-sectional structure of a charge-storable dielectric film disclosed in the publication identified above. As shown in FIG. 8, this structure includes: a titanium (Ti) film 101; a titanium dioxide ($TiO_2$) film 102; a high-dielectric-constant film 103 made of (Ba, Pb)(Zr, Ti)$O_3$; a $TiO_2$ film 104; and a Ti film 105, which are stacked in this order on a substrate 100.

In this conventional DRAM structure, a charge-storable dielectric film is formed by interposing a pair of $TiO_2$ films 102 and 104 between the high-dielectric-constant film 103 and the Ti films 101 and 105 functioning as respective electrodes, thereby suppressing the leakage current flowing through the high-dielectric-constant film 103. A smaller amount of current leaks through the $TiO_2$ films 102 and 104 as compared with the (Ba, Pb)(Zr, Ti)$O_3$ film 103, and the $TiO_2$ films 102 and 104 have a higher dielectric breakdown voltage than the (Ba, Pb)(Zr, Ti)$O_3$ film 103. Accordingly, a charge-storable dielectric film can be formed with a leakage current reduced in total.

However, in this conventional DRAM structure, the high-dielectric-constant film 103, which is originally intended to be a capacitive insulating film, is sandwiched between the $TiO_2$ films 102 and 104 to reduce the leakage current. As a result, the relative dielectric constant of these three insulating films decreases in total. This is because the relative dielectric constant of the $TiO_2$ film is as low as about 25. Also, the total relative dielectric constant of these three insulating films interposed between the upper and lower Ti films 101 and 105 is calculated the same way as the capacitance of a circuit in which three capacitors, formed by these insulating films, are connected in series to each other. Thus, the DRAM structure shown in FIG. 8 and disclosed in the above-identified document has decreased charge storability per unit area. This is one of the factors interfering with the downsizing of an overall memory structure.

SUMMARY OF THE INVENTION

An object of the present invention is providing a downsized semiconductor memory device and a method for fabricating the same by suppressing an increase in leakage current flowing through a charge-storable dielectric film and a decrease in relative dielectric constant thereof.

A semiconductor memory device according to the present invention includes a plurality of cells. Each of these cells includes: a lower electrode; a charge-storable dielectric film, formed on the lower electrode and made of a dielectric in which information is storable; and an upper electrode formed on the charge-storable dielectric film. The charge-storable dielectric film includes first and second dielectric layers. The first dielectric layer is made of an oxide containing at least two metal elements and a dielectric with a high relative dielectric constant or a ferroelectric. The second dielectric layer is formed over and/or under the first dielectric layer and made of an oxide containing at least two metal elements. A smaller amount of leakage current than that flowing through the first dielectric layer flows through the second dielectric layer.

In this structure, the second dielectric layer is an oxide film containing at least two metal elements, not an oxide film containing a single metal element such as a $TiO_2$ film conventionally used. Thus, by adjusting the composition of the second dielectric layer, the relative dielectric constant and the amount of leakage current of the second dielectric layer can be appropriately controlled. For example, if the mole fraction of one of these two metal elements, which can contribute to the suppression of the leakage current better than the other, is increased to precipitate an oxide of the metal element into the grain boundary, then the leakage current can be suppressed effectively. And since the crystal grains themselves are those of a binary metal oxide with a higher relative dielectric constant, the total dielectric constant of the charge-storable dielectric film can be kept high. Accordingly, the semiconductor memory device can be further downsized.

In one embodiment of the present invention, the first dielectric layer preferably has an approximately stoichiometric composition, while the second dielectric layer preferably has a composition deviated from the stoichiometric composition thereof.

In such an embodiment, since the second dielectric layer preferably has a non-stoichiometric composition, an oxide of one of at least two metal elements contained in the second dielectric layer precipitates into the grain boundary. Accordingly, a high relative dielectric constant can be easily maintained with the leakage current suppressed.

In another embodiment, the first dielectric layer preferably contains the three elements of Ba, Sr and Ti.

A material containing these three elements of Ba, Sr and Ti is known as a material called "BST" with a high dielectric constant. By forming the first dielectric layer out of this BST layer, the total dielectric constant of the chargestorable dielectric film can be kept high.

In still another embodiment, the first dielectric layer preferably has a composition expressed by $Ba_xSr_{1-x}TiO_3$, where $0 \leq x \leq 1$.

In such an embodiment, the first dielectric layer is a BST film containing Ti at 50%. Accordingly, a high relative dielectric constant can be attained.

In still another embodiment, the second dielectric layer preferably contains the three elements of Ba, Sr and Ti.

In such an embodiment, since the relative dielectric constant of the second dielectric layer is also kept high, increase in leakage current flowing through the entire charge-storable dielectric film and decrease in relative dielectric constant thereof can be suppressed with more certainty.

In still another embodiment, the number of Ti atoms preferably accounts for larger than 50% and equal to or smaller than 60% of the total number of Ba, Sr and Ti atoms in the second dielectric layer.

It is already known empirically that the dielectric constant of a BST film is relatively high and the amount of leakage current is relatively small within this range. As a result, increase in leakage current flowing through the entire charge-storable dielectric film and decrease in relative dielectric constant thereof can be suppressed with more certainty.

In still another embodiment, both the first and second dielectric layers of the charge-storable dielectric film may contain the three elements of Ba, Sr and Ti. The first and second dielectric layers may be formed such that a ratio of the number of Ti atoms to the total number of Ba, Sr and Ti atoms in the charge-storable dielectric film can be represented as a continuous function of a distance as measured from the lower surface of the charge-storable dielectric film in the thickness direction.

In such an embodiment, the composition of the charge-storable dielectric film does not change discontinuously or abruptly. Accordingly, a charge-storable dielectric film with less strained, larger crystal grains can be obtained and an even higher relative dielectric constant can be attained.

In still another embodiment, the ratio of the number of Ti atoms to the total number of Ba, Sr and Ti atoms is preferably 50% in part of the charge-storable dielectric film that corresponds to at least one half of the total thickness of the charge-storable dielectric film.

In such an embodiment, an oxide of Ti or the like, which precipitates into the grain boundary, can exist stably.

A method for fabricating a semiconductor memory device according to the present invention includes the steps of: a) forming a lower electrode over a substrate; b) forming a charge-storable dielectric film, made of a dielectric in which information is storable, on the lower electrode; and c) forming an upper electrode on the charge-storable dielectric film. The step b) includes: i) forming a first dielectric layer made of an oxide containing at least two metal elements and a dielectric with a high relative dielectric constant or a ferroelectric; and ii) forming a second dielectric layer over and/or under the first dielectric layer. The second dielectric layer is made of an oxide containing the same elements as those of the first dielectric layer but has a different composition than that of the first dielectric layer. The amount of leakage current flowing through the second dielectric layer is smaller than that flowing through the first dielectric layer.

According to this method, the semiconductor memory device attaining the excellent effects described above can be formed easily.

In one embodiment of the present invention, in the step i), the first dielectric layer is preferably formed to contain the three elements of Ba, Sr and Ti substantially at a stoichiometric composition. In the step ii), the second dielectric layer is preferably formed to contain the three elements of Ba, Sr and Ti at such a composition that the number of Ti atoms accounts for larger than 50% and equal to or smaller than 60% of the total number of Ba, Sr and Ti atoms.

In this particular embodiment, a heat treatment is preferably conducted to heat the substrate at 650° C. or more before the steps i) and ii) are performed.

In accordance with this method, the relative dielectric constants of the respective dielectric layers made of BST can be increased.

In another embodiment of the present invention, in the step b), while the first and second dielectric layers are formed by a metalorganic chemical vapor deposition process, the temperature of the substrate is changed, thereby changing the ratio of the number of Ti atoms to the total number of Ba, Sr and Ti atoms.

In accordance with this method, the compositions of the respective dielectric layers can be adjusted easily without changing the composition of the source material. Accordingly, this method is suitable to mass production.

In this particular embodiment, in the step b), the temperature of the substrate is preferably kept constant in the step i), but changed in the step ii).

DESCRIPTION OF THE PREFERRED EMBODIMENTS

Embodiment 1

First, a semiconductor memory device according to a first exemplary embodiment of the present invention will be described with reference to FIGS. 1 through 5. The semiconductor memory device of this embodiment is different from an ordinary semiconductor memory device mainly in the structure of a charge-storable dielectric film and a method for making the same. Accordingly, the structure, operation and the fabrication method of the charge-storable dielectric film and surrounding members thereof will be described in detail, but the description of the other members thereof will be omitted herein unless necessary.

Figure 1:
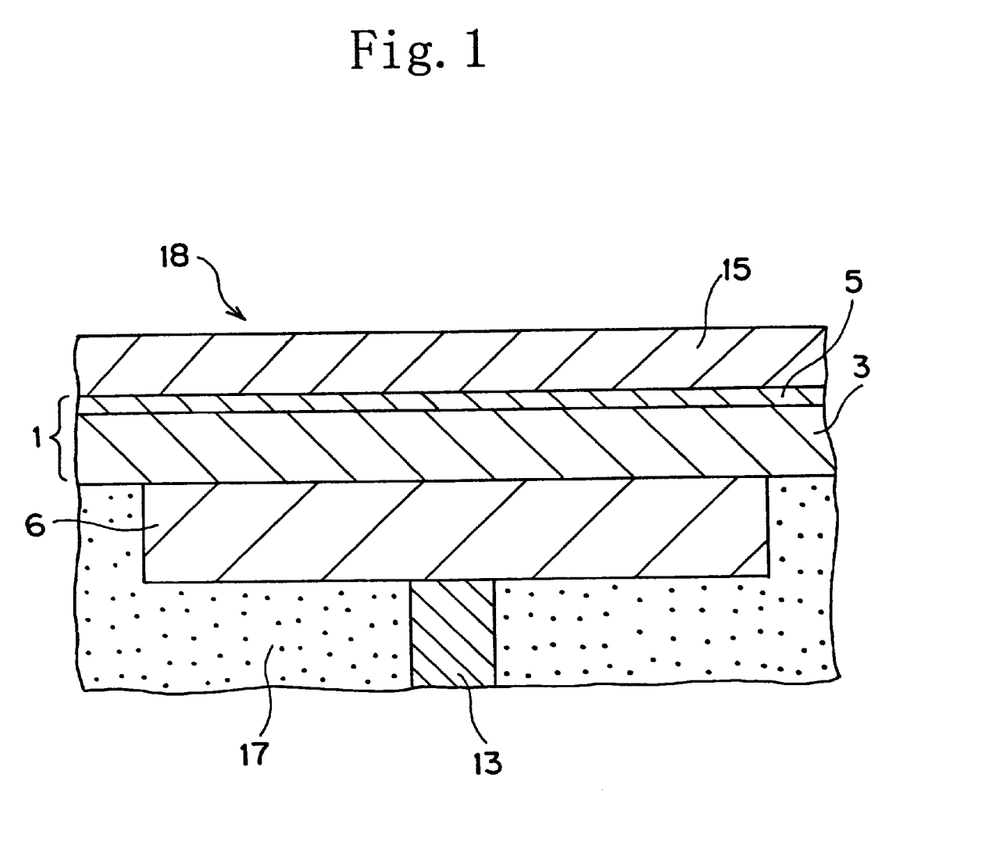
FIG. 1 is a partial cross-sectional view illustrating a structure of a cell and its neighboring portions of a semiconductor memory device according to a first embodiment of the present invention.

FIG. 1 is a cross-sectional view illustrating a structure of a cell 18 and its neighboring portions of a semiconductor memory device of this embodiment.

As shown in FIG. 1, the cell 18 includes a charge-storable dielectric film 1 consisting of a high-dielectric-constant layer 3 and a low-leakage-current layer 5. The high-dielectric-constant layer 3 is formed out of a BST thin film with a thickness of 20 nm, whose composition (or the Ba:Sr:Ti ratio) is stoichiometric, i.e., 25:25:50. On the other hand, the low-leakage-current layer 5 is formed out of a thin film, which contains at least Ba, Sr and Ti and the thickness of which is 5 nm. The composition of the low-leakage-current layer 5 is non-stoichiometric. In this embodiment, the low-leakage-current layer 5 is made of a compound in which the ratio of the number of Ti atoms to the total number of Ba, Sr and Ti atoms (hereinafter, simply referred to as a "Ti/(Ba+Sr+Ti) ratio" is 55%, e.g., a compound with a composition represented as $Ba_{0.45}Sr_{0.45}Ti_{1.10}$, for example.

Also, lower and upper electrodes 6 and 15 are provided under and over the charge-storable dielectric film 1, respectively. The lower electrode 6 is formed by stacking a ruthenium film with a thickness of 50 nm and a ruthenium oxide film with a thickness of 100 nm in this order on a titanium nitride film with a thickness of 30 nm, for example. An interconnect 13, made of polycrystalline silicon, for example, is formed under the lower electrode 6. This interconnect 13 is filled in a contact hole formed in an insulating layer 17. In an ordinary DRAM, the interconnect 13 may be connected to the drain region of a transistor not shown in FIG. 1. The upper electrode 15 is formed over the low-leakage-current layer 5 out of a ruthenium film with a thickness of 50 nm, for example.

Next, it will be described with reference to FIG. 2 how the leakage current, flowing through the charge-storable dielectric film, can be reduced in the semiconductor memory device of this embodiment.

Figure 2:
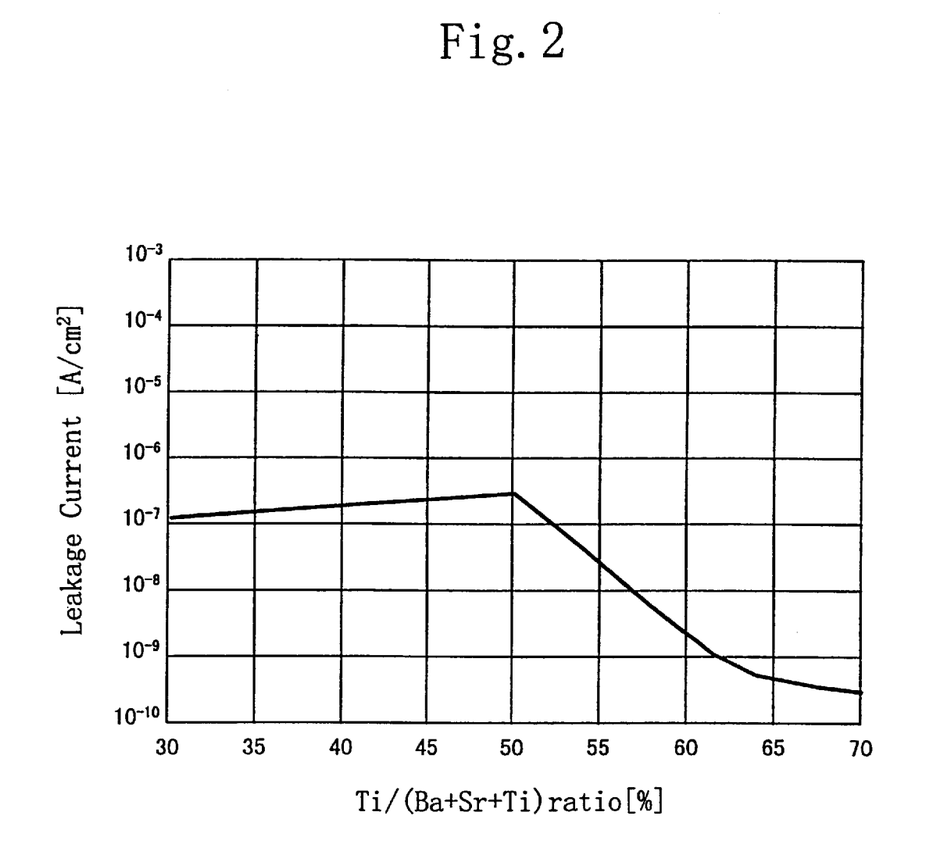
FIG. 2 is a graph illustrating how the leakage current flowing through a BST film changes with the content of Ti in the BST film in the first embodiment.

FIG. 2 illustrates a correlation between the Ti/(Ba+Sr+Ti) ratio in the BST thin film for the high-dielectric-constant layer 3 or the low-leakage-current layer 5 and the leakage current flowing therethrough when a voltage of +0.5 V is applied thereto. It should be noted that the ratio of Ba to Sr in the BST thin film may be arbitrarily defined. However, since it is known that the relative dielectric constant of the BST film reaches its maximum when Ba:Sr=1:1, the ratio is also set at 1:1 in this embodiment.

As is clear from FIG. 2, the leakage current reaches its maximum when the BST thin film for the high-dielectric-constant layer 3 or the low-leakage-current layer 5 has a stoichiometric composition, i.e., Ti/(Ba+Sr+Ti)=50%. But it can also be understood that if the content of Ti in the BST thin film is increased, then the leakage current can be reduced considerably. For example, when the content of Ti is increased by five percent (i.e., when Ti/(Ba+Sr+Ti)=55%), the leakage current can be reduced to about one-tenth of that of the BST film with the stoichiometric composition. Also, since the amount of the leakage current flowing through the BST film is less dependent on the thickness thereof, the thickness of the low-leakage-current layer 5 need not be so large.

As shown in FIG. 2, the present inventors found that by providing a thin low-leakage-current layer 5 with a thickness of 5 nm for the charge-storable dielectric film 1 as in this embodiment, the leakage current flowing through the film 1 can be reduced by about one order of magnitude compared to providing a BST film with a stoichiometric composition.

Figure 3:
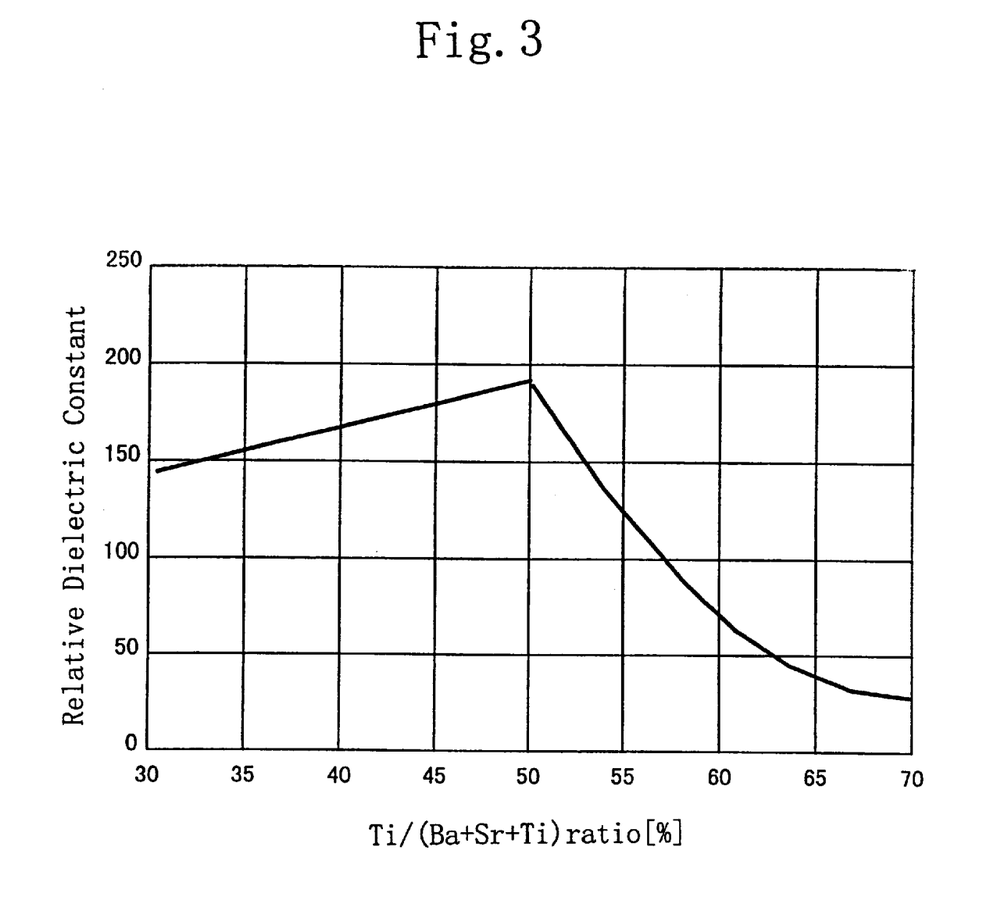
FIG. 3 is a graph illustrating how the relative dielectric constant of the BST film changes with the content of Ti in the BST film in the first embodiment.

FIG. 3 illustrates how the relative dielectric constant of the BST thin film changes with the Ti/(Ba+Sr+Ti) ratio. Since the high-dielectric-constant layer 3 and the low-leakage-current layer 5 together constitute a charge-storable dielectric film for a DRAM, the higher the relative dielectric constants of the materials for these layers 3 and 5, the higher the charge storability per unit area and the more advantageous. The relative dielectric constant reaches its maximum when the BST film has its stoichiometric composition, i.e., when Ti/(Ba+Sr+Ti)=50%. In this embodiment, the maximum dielectric constant was about 190. As the content of Ti in the BST film deviates from the stoichiometric composition, the relative dielectric constant of the film changes correspondingly. More specifically, as the content of Ti increases, the relative dielectric constant decreases drastically. However, the present inventors found that even when the content of Ti was 55%, the relative dielectric constant of the BST film was still as high as 125.

In this case, the key point is the relative dielectric constant of the entire charge-storable dielectric film 1. The relative dielectric constant $\mu$ of the entire charge-storable dielectric film 1 is given by $$1/\mu=[m/\{(m+n)\cdot\mu1\}]+[n/\{(m+n)\cdot\mu2\}]$$

where $\mu 1$ and $\mu 2$ are respective relative dielectric constants of the high-dielectric-constant layer 3 and the low-leakage-current layer 5 and m:n is a ratio of the thickness of the high-dielectric-constant layer 3 to that of the low-leakage-current layer 5.

Accordingly, by adjusting the compositions and thicknesses of the respective BST films for the high-dielectric-constant layer 3 and the low-leakage-current layer 5, the overall characteristic of the entire charge-storable dielectric film 1, i.e., the relative dielectric constant and the leakage current thereof, can be controlled at a desired one. Thus, in this embodiment, the relative dielectric constant of the entire charge-storable dielectric film 1 is set at 75% or more (specifically, $\mu \geq 142.5$) of that of a charge-storable dielectric film totally composed of a BST film with its stoichiometric composition. For example, suppose the thicknesses m and n of the high-dielectric-constant layer 3 and the low-leakage-current layer 5 are 20 nm and 5 nm, respectively, and the relative dielectric constants $\mu 1$ and $\mu 2$ thereof are 190 and 75, respectively. Then, the relative dielectric constant $\mu$ of the entire charge-storable dielectric film 1 is given by $$\mu=1/[\{4/(5\cdot190)\}+\{1/\{(5\cdot75)\}]=145$$

This relative dielectric constant $\mu$ is larger than 142.5, and has not decreased so much. If the relative dielectric constant of the low-leakage-current layer 5 is to be 75 or more, then the Ti/(Ba+Sr+Ti) ratio in the BST film for the low-leakage-current layer 5 should be 60% or less.

In summary, by setting the Ti/(Ba+Sr+Ti) ratio in the BST film for the low-leakage-current layer 5 within the range from 55 to 60% when the high-dielectric-constant layer 3 is 29 nm thick with a stoichiometric composition and the low-leakage-current layer 5 is about 5 nm thick, a small leakage current flows through the charge-storable dielectric film 1 and its charge storability per unit area is high.

In contrast, if the $TiO_2$ film (relative dielectric constant thereof is about 25) described in the above-identified document is substituted for the low-leakage-current layer 5, then the relative dielectric constant $\mu$ of the entire charge-storable dielectric film 1 drastically decreases to about 80. In other words, it can be understood that remarkable effects can be attained by the present invention.

Figure 4:
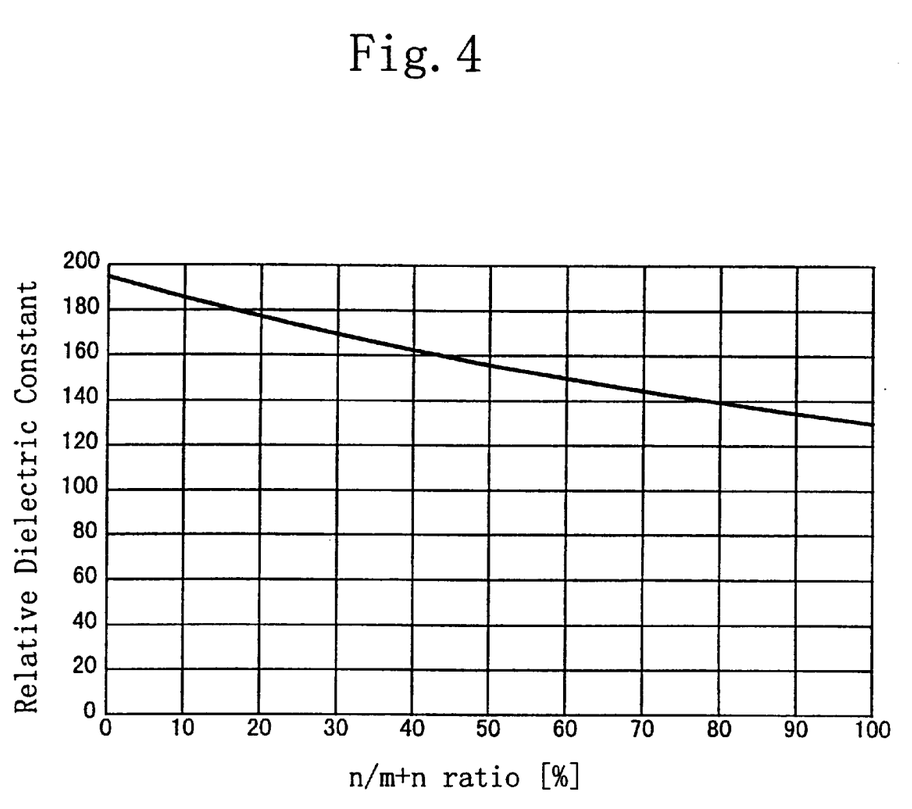
FIG. 4 is a graph illustrating a relationship between a ratio of the thickness of a low-leakage-current layer to the total thickness of a charge-storable dielectric film and the relative dielectric constant of the charge-storable dielectric film in the first embodiment.

Naturally, the larger the ratio of the thickness n of the low-leakage-current layer 5 to the total thickness m+n of the charge-storable dielectric film 1 (hereinafter, simply referred to as an "n/m+n ratio"), the lower the relative dielectric constant of the charge-storable dielectric film 1 tends to be. FIG. 4 illustrates how the relative dielectric constant of the entire charge-storable dielectric film 1 changes depending on the ratio n/m+n of the thickness n of the low-leakage-current layer 5 (made of BST with a Ti/(Ba+Sr+Ti) ratio of 55%) to the total thickness m+n of the charge-storable dielectric film 1. As shown in FIG. 4, when the n/m+n ratio is 50%, for example, the relative dielectric constant of the charge-storable dielectric film 1 decreases to about 155. In order to suppress such a decrease in relative dielectric constant at 20% or less, the n/m+n ratio should be less than 50%.

As described above, in the semiconductor memory device of this embodiment, the low-leakage-current layer 5, made of BST in which the mole fraction of Ti deviates from the stoichiometric composition, is formed on the high-dielectric-constant layer 3 made of BST with the stoichiometric composition. And these layers 3 and 5 together constitute the charge-storable dielectric film 1. As a result, a smaller leakage current flows through the charge-storable dielectric film 1 and its charge storability per unit area is high. That is to say, the present invention was conceived based on the finding that a BST film, in which the mole fraction of Ti deviates from its stoichiometric composition, can have the leakage current drastically reduced and can suppress the decrease in relative dielectric constant. Thus, according to the present invention, the leakage current flowing through the entire charge-storable dielectric film 1, in which capacitors are connected in series to each other, can be reduced, the decrease in relative dielectric constant thereof can be minimized and yet sufficiently high charge storability can be maintained. Accordingly, the present invention can greatly contribute to further downsizing of a semiconductor memory device.

As shown in FIG. 2, even if the low-leakage-current layer 5 is made of BST with the content of Ti, i.e., the Ti/(Ba+Sr+Ti) ratio, of less than 50% defined by stoichiometry, the leakage current can be reduced to a certain degree. However, the leakage current can be reduced even more drastically if the low-leakage-current layer 5 is made of BST with the content of Ti exceeding 50% defined by stoichiometry. This is because in a BST film with a larger content of Ti, the excessive Ti is turned into titanium oxide, precipitates into the grain boundary in the BST film and exists there in a thermal stabilized state. On the other hand, in a BST film with a smaller content of Ti, various compounds like barium carbide and strontium carbide precipitate into the grain boundary in the BST film, and therefore the leakage current decreases to a certain degree. However, since these compounds are likely to decompose at around 650° C., decomposition is caused during a heat treatment and a leakage current path is probably formed along the grain boundary in the BST film.

Thus, particularly when the temperature is as high as 650° C. or more after the charge-storable dielectric film 1 has been formed, the low-leakage-current layer 5, made of BST with the content of Ti exceeding 50%, can reduce the leakage current with a lot more certainty. In using a BST film as a charge-storable dielectric film in a conventional process, the charge-storable dielectric film 1 is formed and then subjected to rapid thermal annealing (RTA) at 700° C. to obtain a desired high relative dielectric constant. In such a case, the content of Ti in the low-leakage-current layer should be larger than the value defined by stoichiometry.

Hereinafter, a method for fabricating the semiconductor memory device of this embodiment, or the cell and its neighboring portions thereof, in particular, will be described with reference to FIGS. 5(a) through 5(d).

Figure 5A:
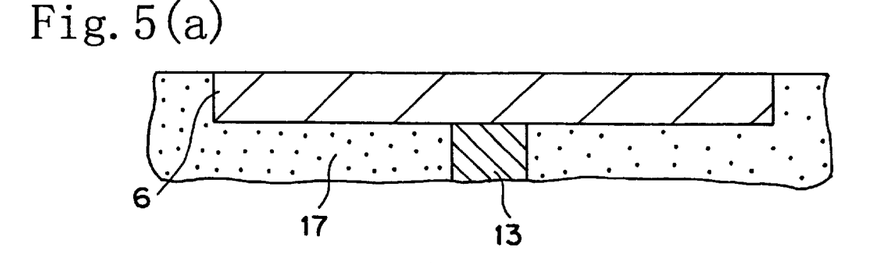
FIGS. 5(a) through 5(d) are cross-sectional views illustrating respective process steps for fabricating the semiconductor memory device of the first embodiment.

First, in the process step shown in FIG. 5(a), a contact hole is opened in an insulating layer 17 on a substrate in the same way as a common method for fabricating a semiconductor memory device. And an interconnect 13 is formed out of a polycrystalline silicon plug to fill in the contact hole. Next, a lower electrode 6 is formed on the interconnect 13 and connected thereto. In this embodiment, the lower electrode 6 may be formed in the following manner. First, a shallow concave portion is formed over a wide area of the insulating layer 17 including the region where the interconnect 13 is formed. Next, a titanium nitride film, a ruthenium film and a ruthenium oxide film are deposited in this order over the entire substrate by a sputtering technique, for example, to be about 30 nm, about 50 nm and about 100 nm thick, respectively. Then, these films are planarized by chemical/mechanical polishing (CMP), for example, thereby filling in the concave portion with this multi-layered film. As a result, the lower electrode 6 is formed to have an upper surface planarized with, or at the same level as, that of the surrounding insulating layer 17 and to be electrically isolated from the counterpart of the adjacent cell.

Figure 5B:
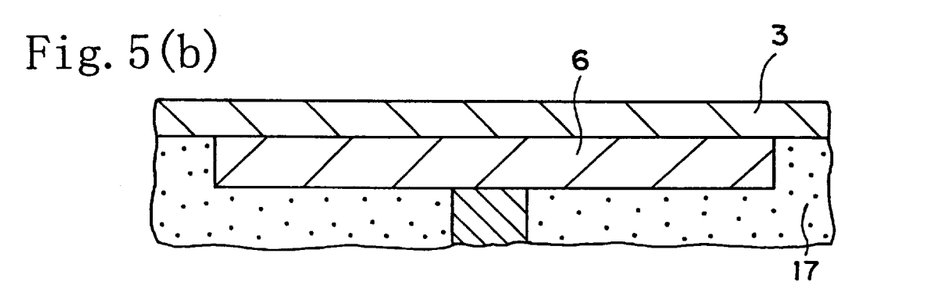

Next, in the process step shown in FIG. 5(b), a high-dielectric-constant layer 3 is formed by a metalorganic chemical vapor deposition (MOCVD) process, for example. This high-dielectric-constant layer 3 may be formed in the following manner. First, $Ba(DPM)_2$, $Sr(DPM)_2$ and TiO $(DPM)_2$, which are all β-diketone organo-metallic complexes, are respectively dissolved in n-butyl acetate at a concentration of 0.1 mol/L to form liquid source materials, which are mixed, vaporized by raising the temperature thereof and then introduced into the reactor using Ar gas as a carrier gas. Then, this mixed gas is allowed to thermally react by heating the substrate at 600° C., for example, within an atmosphere where the pressure is 5 Torr and the partial pressure of oxygen is 25%, thereby depositing a BST film as the high-dielectric-constant layer 3. In this embodiment, the mixture ratio of the respective liquid source materials containing $Ba(DPM)_2$, $Sr(DPM)_2$ and TiO $(DPM)_2$ is controlled at 35:35:30, for example, thereby setting the ratio of the number of Ba, Sr and Ti atoms in the BST film to 25:25:50.

Subsequently, in the process step shown in FIG. 5(c), the respective liquid source materials containing $Ba(DPM)_2$, $Sr(DPM)_2$ and $TiO(DPM)_2$ are mixed at a ratio of 30:30:40, for example, thereby depositing a BST film, containing Ti at 55%, as the low-leakage-current layer 5.

Figure 5C:
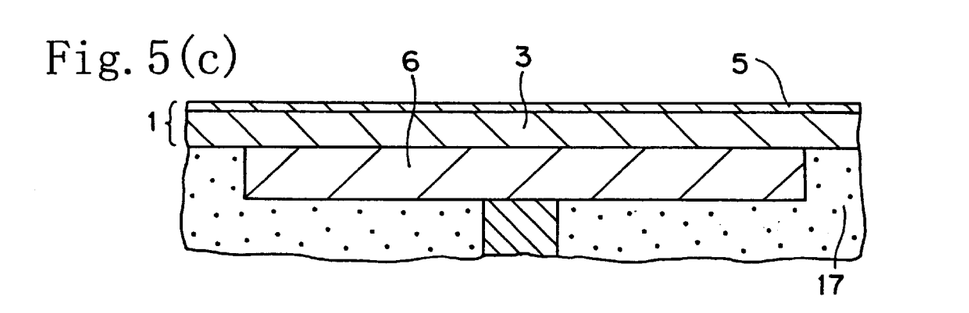
Figure 5D:
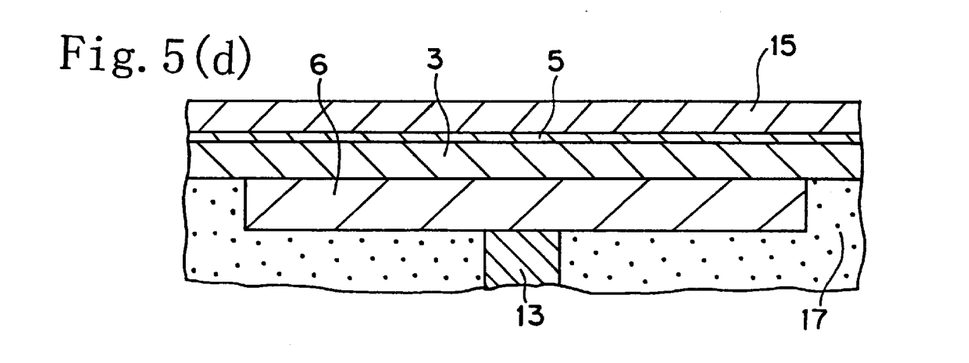

Finally, in the process step shown in FIG. 5(d), a ruthenium film is deposited by a sputtering technique, for example, to be about 100 nm thick and then patterned, thereby forming an upper electrode 15.

In the process steps shown in FIGS. 5(b) and 5(c), the content of Ti may be changed by any other technique. For example, the present inventors found that even if the respective liquid source materials, containing the organo-metallic complexes, are kept mixed at the same ratio, the content of Ti in the BST film increases with a rise in substrate temperature, but decreases with a fall in substrate temperature. According to this principle, if the substrate temperature is raised from 600° C. by 50° C., for example, after the BST film has been deposited in the step shown in FIG. 5(b) as the high-dielectric-constant layer 3 to be 20 nm thick without changing the flow rate of the Ar gas containing the vaporized liquid source materials, then the content of Ti in the BST film formed in the succeeding step shown in FIG. 5(c) as the low-leakage-current layer 5 can be increased from 50% to 55%. In accordance with such a method, since the mixture ratio of the liquid source materials need not be changed, the liquid source materials do not have to be replaced in an MOCVD apparatus (i.e., in the entire system including a path through which the liquid source materials are supplied and piping). In other words, the content of Ti can be changed easily without changing the composition of the source materials. It should be noted that to definitely change the composition of the BST film to be formed, the supply of the source materials to the reactor may be suspended while the substrate temperature is being changed.

Also, the surface of a thin film, made of ruthenium, platinum or the like generally used for the lower electrode 6, is ordinarily roughened if the temperature is raised with no film deposited on that surface. However, since the temperature is raised after the high-dielectric-constant layer 3 has been deposited to be 20 nm thick, such roughening of the surface of the lower electrode 6 can also be suppressed.

Furthermore, if a heat treatment is conducted by a conventional technique within a nitrogen ambient at 700° C. for 30 minutes, for example, before or after the upper electrode 15 is formed during the process, the relative dielectric constant of the charge-storable dielectric film 1 can be further increased and the leakage current flowing therethrough can be further reduced.

Figure 6A:
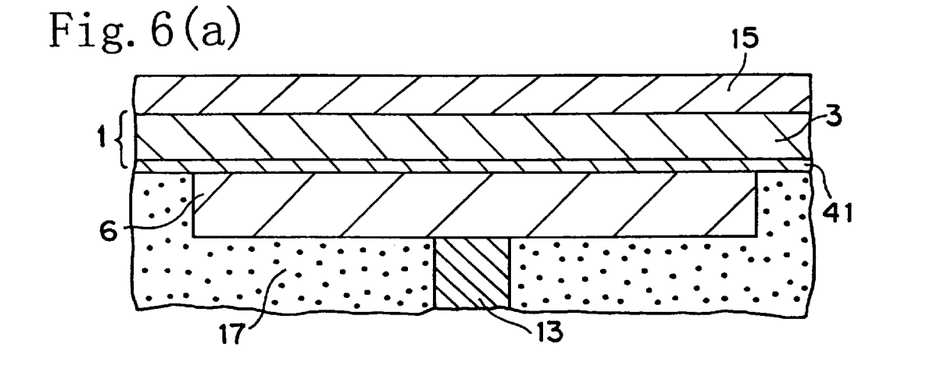
FIG. 6(a) is a partial cross-sectional view illustrating a structure of a cell and its neighboring portions of a semiconductor memory device according to a modified example of the first embodiment in which a low-leakage-current layer 20 is formed under a high-dielectric-constant film.
Figure 6B:
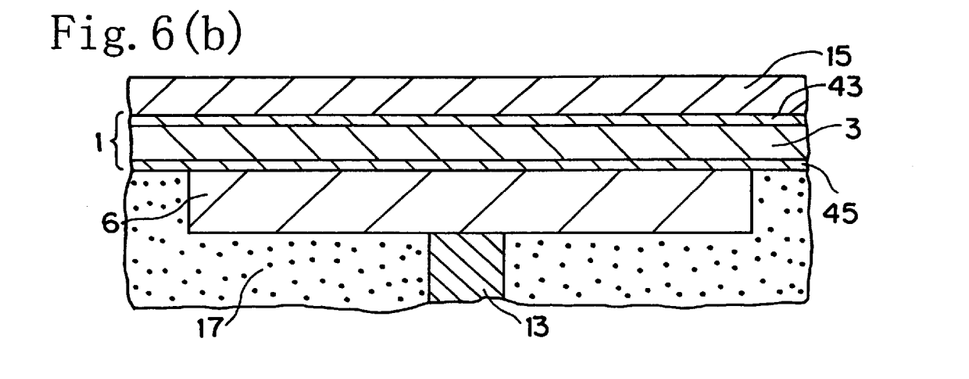
FIG. 6(b) is a partial cross-sectional view illustrating a structure of a cell and its neighboring portions of a semiconductor memory device according to another modified example of the first embodiment in which a pair of low-leakage current layers are formed over and under the high-dielectric-constant film, respectively.

Next, modified examples of this embodiment will be described. FIGS. 6(a) and 6(b) are cross-sectional views illustrating exemplary alternate structures of a cell of a semiconductor memory device according to respective modified examples of the first embodiment. The leakage current can be suppressed more effectively if the low-leakage-current layer 5 is provided closer to the electrode into which electrons are injected during the operation of the semiconductor memory device. Thus, if charging is performed while the lower electrode 6 is at a potential level higher than that of the upper electrode 15, the leakage current can be suppressed more effectively with the arrangement shown in FIG. 1 where the low-leakage-current layer 5 is placed over the high-dielectric-constant layer 3. Alternatively, if charging is performed while the upper electrode 15 is at a potential level higher than that of the lower electrode 6, then a low-leakage-current layer 41 is preferably placed under the high-dielectric-constant layer 3, i.e., between the layer 3 and the lower electrode 6, as shown in FIG. 6(a). Also, if the semiconductor memory device is driven by applying an electric field with both polarities to the charge-storable dielectric film 1, then a pair of low-leakage-current layers 43 and 45 are preferably formed over and under the high-dielectric-constant layer 3, i.e., between the upper electrode 15 and the layer 3 and between the lower electrode 6 and the layer 3.

In either structure shown in FIG. 6(a) or 6(b), the leakage current can be reduced and the decrease in relative dielectric constant can be suppressed.

In this embodiment, the BST film is formed by an MOCVD process. Alternatively, the BST film can be deposited by any technique other than the technique exemplified in this embodiment so long as the content of Ti in the BST film can be controlled.

For example, in employing a sputtering technique, a multilayer structure consisting of a high-dielectric-constant layer and a low-leakage-current layer with similar structures to those of the BST films according to this embodiment can be obtained by using at least two targets. That is to say, a target for depositing a BST film with a stoichiometric composition and a target for depositing a film, in which the content of Ti deviates from the stoichiometric composition thereof, may be used.

On the other hand, in employing a spin coating technique, a multilayer structure consisting of a high-dielectric-constant layer and a low-leakage-current layer with similar structures to those of the BST films according to this embodiment can be obtained by using at least two types of coating solutions with respectively different compositions.

Furthermore, according to the present invention, the materials for the upper and lower electrodes are not limited to those exemplified in the first embodiment. For example, the same effects can also be attained even if these electrodes, to be in contact with a film made of a dielectric oxide (i.e., BST), are made of platinum, palladium, iridium, iridium oxide, rhodium or the like.

Moreover, according to the present invention, the structures of the upper and lower electrodes are not limited to those illustrated in the first embodiment. For example, even when the present invention is applied to a known structure with an increased electrode area in which the respective layers are stacked on a columnar lower electrode, the leakage current still can be reduced.

Embodiment 2

Next, a semiconductor memory device according to a second exemplary embodiment of the present invention will be described with reference to FIG. 7. The semiconductor memory device of the second embodiment is different from the device of the first embodiment only in the structure and fabrication method of the charge-storable dielectric film. Accordingly, only the structure and the fabrication method of the charge-storable dielectric film and its neighboring portions will be described hereinafter.

Figure 7:
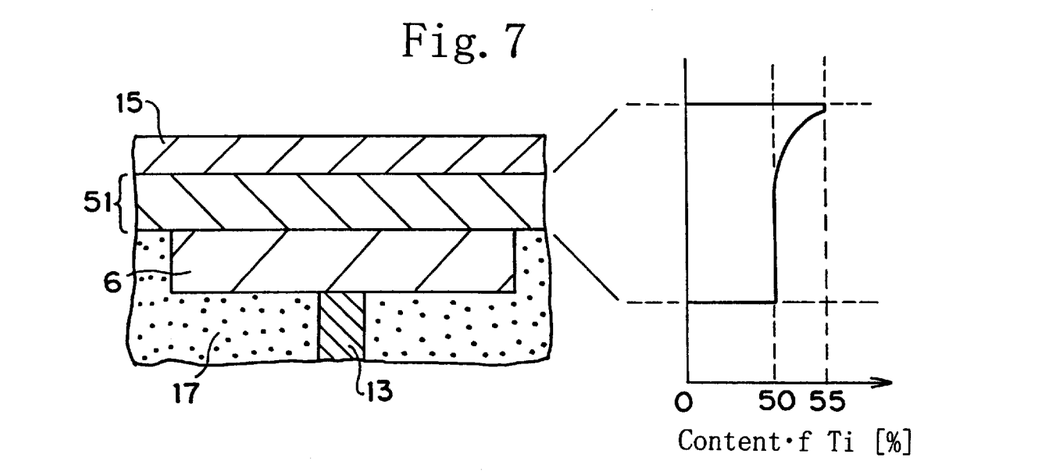
FIG. 7 is a partial cross-sectional view illustrating a structure of a cell and its neighboring portions of a semiconductor memory device according to a second embodiment of the present invention along with a variation in the content of Ti in the charge-storable dielectric film in the thickness direction thereof.

FIG. 7 is a cross-sectional view illustrating a structure of a cell of a semiconductor memory device of the second embodiment, along with a variation in the content of Ti in the charge-storable dielectric film 51 in the thickness direction thereof.

In the semiconductor memory device of this embodiment, the charge-storable dielectric film 51 is apparently formed out of a single BST film, in which Ti has a concentration profile such as that shown in FIG. 7. In other words, the charge-storable dielectric film 51 is formed such that the Ti/(Ba+Sr+Ti) ratio in the charge-storable dielectric film 51 is represented as a continuous function of a distance as measured from the lower surface of the charge-storable dielectric film 51 in the thickness direction. In this embodiment, in most part of the charge-storable dielectric film 51 in contact with the lower electrode 6, the content of Ti, i.e., the Ti/(Ba+Sr+Ti) ratio, is 50% as defined by stoichiometry. In contrast, in a thin part of the charge-storable dielectric film 51 closer to the upper electrode 15, the content of Ti gradually increases upward to finally reach 55%. That is to say, most part of the charge-storable dielectric film 51 functions as a high-dielectric-constant layer and the upper thin part thereof functions as a low-leakage-current layer.

Next, a method of making the charge-storable dielectric film 51 according to this embodiment will be described. Such a film may be formed by an MOCVD process. For example, by changing the mixture ratio of the liquid source materials containing $TiO(DPM)_2$ with time in the process steps shown in FIGS. 5(b) and 5(c) of the first embodiment, the content of Ti in the charge-storable dielectric film 51 can be changed substantially continuously in the thickness direction thereof as shown in FIG. 7. In this case, if the temperature of the substrate is changed, then the content of Ti can also be changed particularly effectively as described in the first embodiment. In general, the temperature of a substrate cannot be raised or lowered instantaneously. Accordingly, if the temperature of the substrate is raised or lowered at a controlled rate, then the content can be changed continuously. The distribution of the Ti content in the thickness direction shown in FIG. 7 can be obtained by gradually raising the temperature of the substrate from 600° C. to 650° C., for example.

In this embodiment, part of the BST film as the charge-storable dielectric film 51 also has a non-stoichiometric composition and functions as a low-leakage-current layer. Accordingly, the same effects as those of the first embodiment can also be attained. Specifically, the decrease in relative dielectric constant of the entire charge-storable dielectric film can be suppressed while reducing the leakage current. As a result, this embodiment can also contribute to further downsizing of a semiconductor memory device.

Also, in the charge-storable dielectric film 51 of this embodiment, the composition of the BST film changes continuously in the thickness direction thereof. Accordingly, the imperfections of the crystal lattice can be reduced in the grains of the BST film as the charge-storable dielectric film 51. That is to say, the crystallinity of the charge-storable dielectric film 51 is superior to that of the BST film included in the charge-storable dielectric film 1 of the first embodiment. As a result, supposing the thickness of the charge-storable dielectric film 51 is 25 nm, for example, the relative dielectric constant thereof is 190, which is even higher than that attained by the first embodiment.

It should be noted that insulating materials for the charge-storable dielectric film of the present invention are not limited to BST exemplified in the foregoing embodiments. For example, an insulating material, which can be either a dielectric or a ferroelectric by modifying its composition in accordance with stoichiometry, may be used. Specifically, an oxide expressed as "$ABO_3$" including sites A and B, like PZT, $BaTiO_3$ or $SrTiO_3$, may be used.

What is claimed is:

1. A method for fabricating a semiconductor memory device, comprising the steps of:

a) forming a lower electrode over a substrate;

b) forming a charge-storable dielectric film on the lower electrode, the charge-storable dielectric film being made of a dielectric in which information is storable; and c) forming an upper electrode on the charge-storable dielectric film, wherein the step b) includes:

i) forming a first dielectric layer made of an oxide containing at least two metal elements and a dielectric with a high relative dielectric constant or a ferroelectric; and ii) forming a second dielectric layer over and/or under the first dielectric layer, the second dielectric layer being made of an oxide containing the same elements as those of the first dielectric layer but having a different composition than that of the first dielectric layer, the amount of leakage current flowing through the second dielectric layer being smaller than that flowing through the first dielectric layer.

2. The method of claim 1, wherein in the step i), the first dielectric layer is formed to contain the three elements of Ba, Sr and Ti substantially at a stoichiometric composition, and wherein in the step ii), the second dielectric layer is formed to contain the three elements of Ba, Sr and Ti at such a composition that the number of Ti atoms accounts for larger than 50% and equal to or smaller than 60% of the total number of Ba, Sr and Ti atoms.

3. The method of claim 1 or 2, wherein a heat treatment is conducted to heat the substrate at 650° C. or more before the steps i) and ii) are performed.

4. The method of claim 2, wherein in the step b), while the first and second dielectric layers are formed by a metalorganic chemical vapor deposition process, the temperature of the substrate is changed, thereby changing the ratio of the number of Ti atoms to the total number of Ba, Sr and Ti atoms.

5. The method of claim 4, wherein in the step b), the temperature of the substrate is kept constant in the step i), but changed in the step ii).

* * * * *